(12) United States Patent
Cho et al.

(10) Patent No.: US 8,194,442 B2
(45) Date of Patent: *Jun. 5, 2012

(54) APPARATUS AND SYSTEMS USING PHASE CHANGE MEMORIES

(75) Inventors: Beak-Hyung Cho, Gyeonggi-do (KR); Du-Eung Kim, Gyeonggi-do (KR); Woo-Yeong Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/091,238

(22) Filed: Apr. 21, 2011

(65) Prior Publication Data

US 2011/0242886 A1 Oct. 6, 2011

Related U.S. Application Data

(63) Continuation of application No. 12/611,606, filed on Nov. 3, 2009, now Pat. No. 7,944,741, which is a continuation of application No. 11/949,342, filed on Dec. 3, 2007, now Pat. No. 7,643,335, which is a continuation-in-part of application No. 11/074,557, filed on Mar. 8, 2005, now Pat. No. 7,304,885.

(30) Foreign Application Priority Data

Jul. 9, 2004 (KR) .......................... 10-2004-0053346

(51) Int. Cl.
*G11C 11/00* (2006.01)
(52) U.S. Cl. .... 365/163; 365/148; 365/194; 365/189.16
(58) Field of Classification Search .................. 365/163, 365/148, 194, 189.16, 189.11
See application file for complete search history.

(56) References Cited

U.S. PATENT DOCUMENTS

| 3,922,648 | A  | 11/1975 | Buckley |
| 6,075,719 | A  | 6/2000 | Lowrey et al. |
| 6,480,438 | B1 | 11/2002 | Park |
| 6,487,113 | B1 | 11/2002 | Park et al. |
| 6,504,196 | B1 | 1/2003 | Rhodes |
| 6,545,907 | B1 | 4/2003 | Lowrey et al. |
| 6,707,712 | B2 | 3/2004 | Lowery |
| 6,839,270 | B2 | 1/2005 | Perner et al. |
| 7,068,253 | B2 | 6/2006 | Kudo et al. |
| 7,075,841 | B2 | 7/2006 | Resta et al. |
| 7,099,180 | B1 | 8/2006 | Dodge et al. |
| 7,099,193 | B2 | 8/2006 | Futatsuyama |
| 7,113,424 | B2 | 9/2006 | Happ et al. |
| 7,184,306 | B2 | 2/2007 | Conley et al. |
| 7,184,314 | B2 | 2/2007 | Hosono et al. |

(Continued)

FOREIGN PATENT DOCUMENTS

JP  2000-011665  1/2000

(Continued)

*Primary Examiner* — David Lam
(74) *Attorney, Agent, or Firm* — Myers Bigel Sibley & Sajovec

(57) ABSTRACT

Apparatus and systems that use phase-change memory devices are provided. The phase-change memory devices may include multiple phase-change memory cells and a reset pulse generation circuit configured to output multiple sequential reset pulses. Each sequential reset pulse is output to a corresponding one of multiple reset lines. Multiple write driver circuits are coupled to corresponding phase change memory cells and to a corresponding one of the reset lines of the reset pulse generation circuit.

13 Claims, 14 Drawing Sheets

U.S. PATENT DOCUMENTS

| | | |
|---|---|---|
| 7,190,615 B2 | 3/2007 | Fujito et al. |
| 7,283,384 B1 * | 10/2007 | Jenne et al. .................. 365/158 |
| 7,304,885 B2 * | 12/2007 | Cho et al. ...................... 365/163 |
| 7,643,335 B2 * | 1/2010 | Cho et al. ...................... 365/163 |
| 7,944,741 B2 * | 5/2011 | Cho et al. ...................... 365/163 |
| 2004/0022085 A1 | 2/2004 | Parkinson et al. |

FOREIGN PATENT DOCUMENTS

| | | |
|---|---|---|
| JP | 03-030181 | 2/2001 |
| JP | 2001-052486 | 2/2001 |
| JP | 2001-222882 | 8/2001 |
| JP | 2002-008368 | 1/2002 |

* cited by examiner

FIG. 4
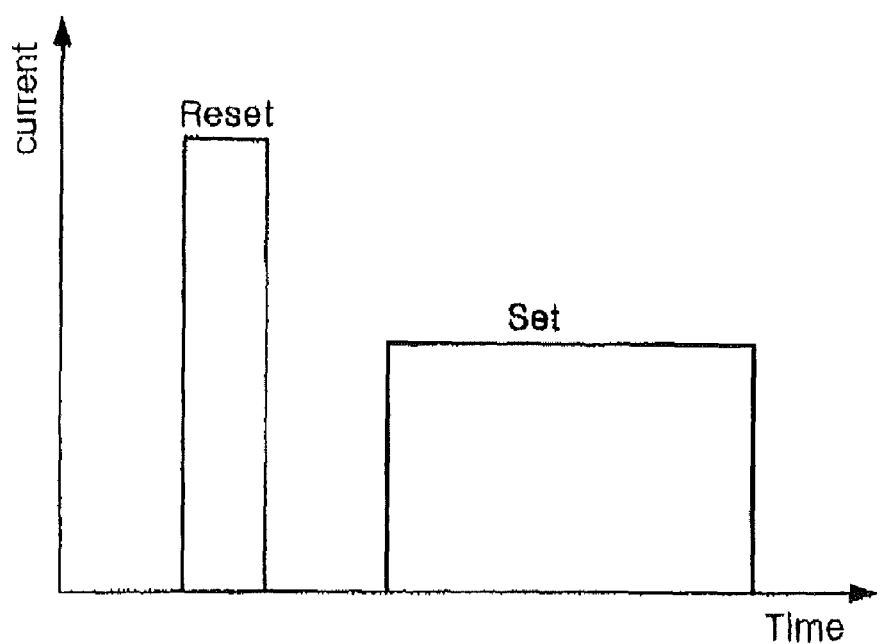
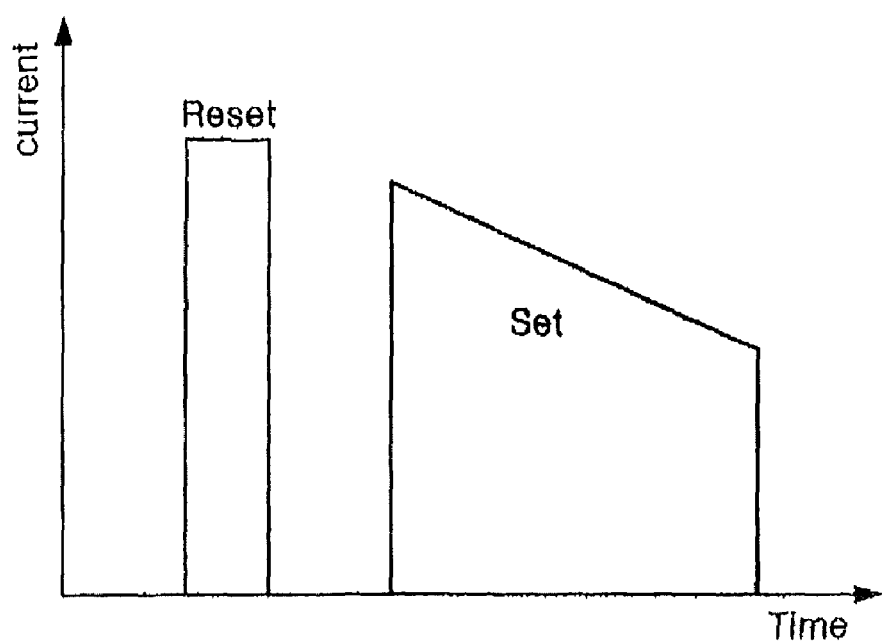

APPARATUS AND SYSTEMS USING PHASE CHANGE MEMORIES

RELATED APPLICATIONS AND CLAIM OF PRIORITY

This application claims priority from and is a continuation application of U.S. patent application Ser. No. 12/611,606, filed on Nov. 3, 2009 now U.S. Pat. No. 7,944,741, which is a continuation application of U.S. patent application No. 11/949,342, filed on Dec. 3, 2007 now U.S. Pat. No. 7,643,335, which is a continuation-in-part of U.S. patent application Ser. No. 11/074,557, filed Mar. 8, 2005 now U.S. Pat. No. 7,304,885, which claims priority from and is related to Korean Patent Application No. 2004-0053346, filed on Jul. 9, 2004, in the Korean Intellectual Property Office, all of the disclosures of which are incorporated herein by reference as if set forth fully herein.

FIELD OF THE INVENTION

The present invention relates to driver circuits and the control of driver circuits for memory elements, and more particularly, to driver circuits and/or methods for phase change memory elements.

BACKGROUND OF THE INVENTION

A phase change memory element is a memory element for storing information using the characteristics of electric conductivity or a resistance difference between a crystalline phase and an amorphous phase of a specific phase change material. The phase change memory element forms a memory cell electrically connected to a transistor element or the like, formed on a semiconductor substrate for addressing and read/write operations of the device. In the memory element, information is stored using a conductivity difference in accordance with the phase change of a region of a memory layer.

FIG. 1A and FIG. 1B illustrate a conventional phase change memory cell 10. As seen in FIG. 1A, the phase change memory cell 10 includes a phase change material 14 between a top electrode 12 and a bottom electrode 18. To increase the current density and, thereby, improve the efficiency of heating of the phase change material 14, the bottom electrode 18 may be connected to the phase change material 14 through a bottom electrode contact (BEC) 16 that has reduced surface area in comparison to the bottom electrode 18. An access transistor 20 may be connected to the bottom electrode 18 and controlled by a word line.

As seen in FIGS. 1A, 1B and 2, the phase change memory cell 10 operates such that a current flowing through the phase change material 14 electrically heats a phase change region, and the structure of the phase change material 14 is reversibly changed to a crystalline state (FIG. 1A) or an amorphous state (FIG. 1B) to store information. In FIG. 1B, the region of the phase change material 14 that changes state to an amorphous state is illustrated by the cross-hatched region adjacent the BEC 16. The stored information can be read by flowing a relatively low current through the phase change region and measuring the resistance of the phase change material. Thus, FIG. 2 illustrates a conventional phase change memory cell 10 where a cell transistor 20 is controlled by a word line WL to control the flow of current ICELL from a bit line BL through the variable resistance C provided by the phase change material.

In setting the region of the phase change material 14 to an amorphous state or a crystalline state, different pulses may be used to control the heating of the phase change material 14. As seen in FIG. 3, a high temperature short duration heating cycle 35 is used to reset the phase change material 14 to an amorphous state and a longer duration lower temperature heating cycle 36 is used to set the phase change material 14 to a crystalline state. In particular, in the short duration cycle 35, the phase change material 14 is heated to a temperature above the melting point, Tm, of the phase change material 14 and then quickly cooled, e.g., within a few nanoseconds, to create an amorphous region in the phase change material 14. In the longer duration cycle 36, the phase change material 14 is heated to a temperature above a crystallizing point, Tx, and below the melting point, Tm, of the phase change material 14 and maintained at that temperature for a predetermined time before cooling to create a crystallized region in the phase change material 14. Thus, the temperature is maintained within a set window of above the crystallizing temperature Tx and below the melting temperature Tm.

FIG. 4 illustrates various current waveforms for programming phase-change memories. In particular, as seen in FIG. 4, the reset current is of shorter duration but greater amplitude than the set current. If multiple memory cells (e.g., more than 16 bits) are reset simultaneously, the peak current may exceed the capability of the power supply, which may result in fluctuations in the output of the power supply. Typically, the number of memory cells in a block of memory cells that are simultaneously programmed (set and reset) has been limited by the reset current considerations.

Various techniques for programming phase-change memory cells are discussed, for example, in U.S. Pat. Nos. 6,545,907; 6,075,719; and 6,487,113.

SUMMARY OF THE INVENTION

Some embodiments of the present invention provide phase-change memory devices that include a plurality of phase-change memory cells and a reset pulse generation circuit configured to output a plurality of sequential reset pulses. Each sequential reset pulse is output to a corresponding one of a plurality of reset lines. A plurality of write driver circuits are coupled to corresponding phase change memory cells and to a corresponding one of the reset lines of the reset pulse generation circuit.

In further embodiments, the reset pulse generation circuit includes a first pulse generation circuit configured to generate a first reset pulse and a plurality of delay lines serially coupled to the first pulse generation circuit to provide successive sequentially delayed reset pulses. The first pulse generation circuit may be responsive to an address transition detection signal to generate the first reset pulse. In other embodiments, the first pulse generation circuit is responsive to a data transition detection signal to generate the first reset pulse. The first pulse generation circuit may include a NAND logic gate having a first control signal as a first input and a delayed version of the first control signal as a second input. The first pulse generation circuit may further include a delay line that receives as an input the first control signal and outputs the delayed version of the first control signal to the second input of the NAND logic gate. Furthermore, a delay of each of the delay lines may be greater than a pulse width of the first reset pulse.

In additional embodiments of the present invention, the plurality of write driver circuits are each coupled to a plurality of bit lines of the phase-change memory cells. The plurality of bit lines may be from a same word of the phase-change memory device or from different words of the phase-change memory device.

In still further embodiments of the present invention, the plurality of write driver circuits are each coupled to a single bit line of the phase-change memory cells.

In some embodiments of the present invention, the duration of each of the plurality of sequential reset pulses may be less than the duration of a set pulse of the phase-change memory device. Furthermore, a set pulse of the phase-change memory device may have a duration of from about 100 to about 500 ns and each of the sequential reset pulses may have a duration of from about 10 to about 50 ns. The sequential reset pulses may be spaced apart from each other by about 10 ns.

Some embodiments of the present invention provide methods of programming a memory device comprising a plurality of phase-change memory cells by sequentially applying a reset pulse to subsets of the phase-change memory cells that are commonly connected to a word line. The plurality of phase-change memory cells are reset by applying a signal of a first pulse width to the phase-change memory cells and set by applying a signal of a second pulse width to the phase-change memory cells and wherein a duration of each of the sequentially applied reset pulses corresponds to the first pulse width and a sum of the durations of the sequentially applied reset pulses is not greater than the second pulse width. The subsets of the phase-change memory cells may be configured so that a different reset pulse is applied to each individual bit line of the memory device or so that a same reset pulse is applied to at least two different bit lines of the memory device. The two different bit lines may each be from different words of the memory device.

In still further embodiments of the present invention, the sequentially applied reset pulses are generated by respective write drivers responsive to corresponding reset control signals and each of the write drivers receives a same set control signal.

In particular embodiments of the present invention, the sequentially applied reset pulses are not overlapping. A set pulse of the phase-change memory device may have a duration of from about 100 to about 500 ns and each of the sequential reset pulses may have a duration of from about 10 to about 50 ns. The sequential reset pulses may be spaced apart from each other by about 10 ns.

Some embodiments of the present invention provide phase-change memory devices that include multiple phase-change memory cells and means for sequentially applying a reset pulse to subsets of the phase-change memory cells that are commonly connected to a word line. The phase-change memory cells may be reset by applying a signal of a first pulse width to the phase-change memory cells and set by applying a signal of a second pulse width to the phase-change memory cells. The means for sequentially applying a reset pulse may include means for sequentially applying a reset pulse wherein a duration of each of the sequentially applied reset pulses corresponds to the first pulse width and a sum of the durations of the sequentially applied reset pulses is not substantially greater than the second pulse width.

In additional embodiments of the present invention, the subsets of the phase-change memory cells are configured so that a different reset pulse is applied to each individual bit line of the memory device. In other embodiments of the present invention, the subsets of the phase-change memory cells are configured so that a same reset pulse is applied to at least two different bit lines of the memory device. The two different bit lines may each be from different words of the memory device.

Further embodiments of the present invention include means for applying a common set pulse to the subsets of the phase-change memory cells that are commonly connected to a word line.

Some embodiments of the present invention provide phase-change memory devices that include multiple phase-change memory cells and multiple write driver circuits coupled to the phase change memory cells. Each of the write driver circuits receives a different, non-overlapping, reset control signal. Each of the write driver circuits may also receive a same set control signal. In certain embodiments, a sum of durations of the different reset control signals is not greater than a duration of the set control signal.

Some embodiments of the present invention provide methods of controlling write driver circuits of a phase-change memory device by providing a different, non-overlapping, reset control signal to each of multiple write driver circuits of the phase-change memory device. A same set control signal may be provided to each of the write driver circuits. In certain embodiments, a sum of durations of the different reset control signals is not greater than a duration of the set control signal.

Some embodiments of the present invention provide a processor based device that includes a processor and a user interface. Some embodiments of the processor based device may include a phase-change memory device that includes multiple phase-change memory cells, a reset pulse generation circuit configured to output multiple sequential reset pulses, each sequential reset pulse being output to a corresponding one of multiple reset lines, and multiple write driver circuits coupled to corresponding phase change memory cells and to a corresponding one of the reset lines of the reset pulse generation circuit.

Some embodiments of the processor based device may include a mobile computing device. In some embodiments, the mobile computing device includes a wireless communication circuit that is configured to be communicatively coupled to a communication system, network and/or device. In some embodiments, the mobile computing device includes a content decoder that is configured to decode content corresponding to audio and/or visual media and a user output module that is configured to output an audio and/or visual signal corresponding to decoded content. In some embodiments, the mobile computing device includes a location signal receiver that is configured to receive at least one signal that is configured to provide information regarding a geographical location of the mobile computing device.

Some embodiments of the present invention may include a mobile computing device that includes a processor and a user interface. In some embodiments, the mobile computing device may include a phase-change memory device that includes multiple phase-change memory cells and multiple write driver circuits coupled to the phase change memory cells wherein each of the write driver circuits receives a different, non-overlapping, reset control signal, wherein each of the write driver circuits also receives a same set control signal, and wherein a sum of durations of the different reset control signals is not greater than a duration of the set control signal.

Some embodiments may include a wireless communication circuit that is configured to be communicatively coupled to a communication system, network and/or device. Some embodiments include a content decoder that is configured to decode content corresponding to audio and/or visual media and a user output module that is configured to output an audio and/or visual signal corresponding to decoded content.

Some embodiments include a location signal receiver that is configured to receive at least one signal that is configured to provide information regarding a geographical location of the mobile computing device.

Some embodiments of the present invention include a semiconductor memory device that includes a phase-change memory cell array including multiple phase-change memory cells, a reset pulse generation circuit configured to output multiple sequential reset pulses, each sequential reset pulse being output to a corresponding one of multiple reset lines, and multiple write driver circuits coupled to corresponding phase change memory cells and to a corresponding one of the reset lines of the reset pulse generation circuit.

In some embodiments, the phase-change memory cells are arranged in a matrix at intersections of multiple word lines and multiple bit lines. Some embodiments include a decoder operative to select one of the phase-change memory cells and a driver that is configured to drive a corresponding one of the word lines and/or one of the bit lines.

Some embodiments of the present invention include an electronic device that includes a card socket that is configured to receive a phase-change memory card that includes multiple phase-change memory cells, a reset pulse generation circuit configured to output multiple sequential reset pulses, each sequential reset pulse being output to a corresponding one of multiple reset lines, and multiple write driver circuits coupled to corresponding phase change memory cells and to a corresponding one of the reset lines of the reset pulse generation circuit. Some embodiments may include a phase-change memory card interface circuit that is configured to electrically couple to the phase-change memory card when the phase-change memory card is housed in and/or approached to the card socket and a processor that is configured to control data communication between the electronic device and the phase-change memory card.

Some embodiments include an imaging device that is configured to photoelectrically convert a light signal into an electrical signal. Some embodiments include a CMOS imager that includes a pixel array of multiple pixels arranged in a predetermined number of multiple rows and multiple columns, a row driver that is configured to selectively drive the rows and a column driver that is configured to selectively drive the columns.

BRIEF DESCRIPTION OF THE DRAWINGS

The above and other features and advantages of the present invention will become more apparent by describing in detail exemplary embodiments thereof with reference to the attached drawings in which:

FIG. 4 is a graph illustrating different set and reset pulses for phase change memories.

DETAILED DESCRIPTION OF THE INVENTION

Figure 1A:
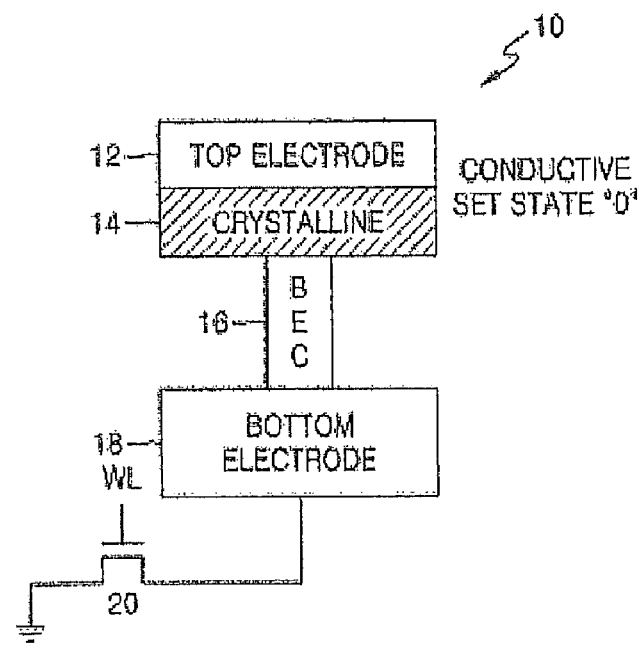
FIGS. 1A and 1B are illustrations of a phase change memory cell.
Figure 1B:
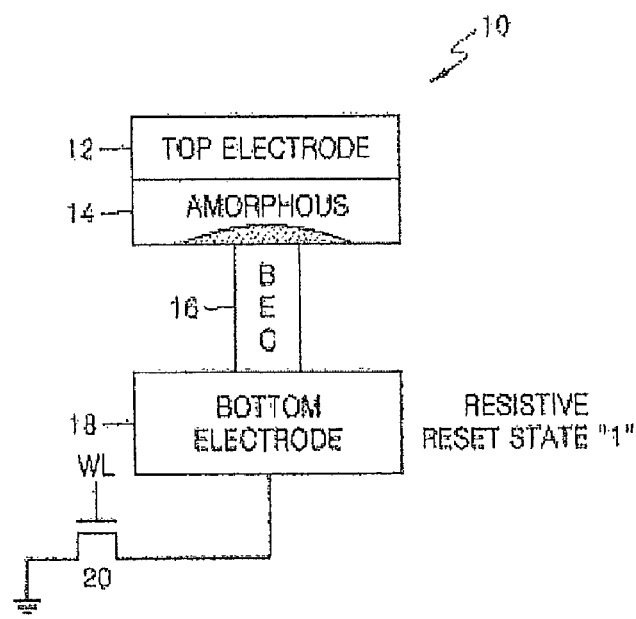
Figure 2:
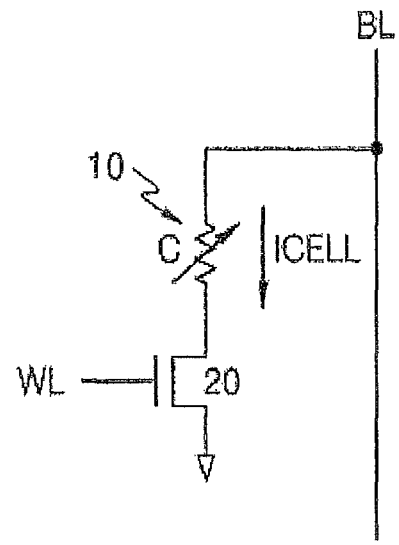
FIG. 2 is a schematic diagram of a phase change memory cell.
Figure 3:
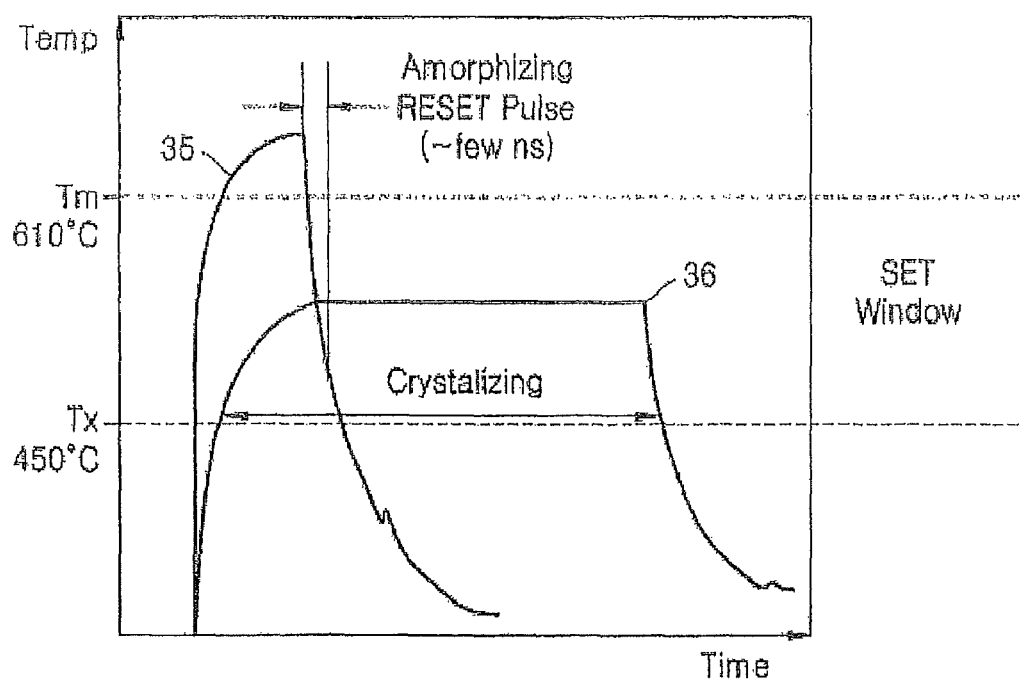
FIG. 3 is graph illustrating the change in state of a phase change material as a function of time and temperature.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

Some embodiments of the present invention provide for sequentially providing reset pulses to phase change memory cells so as to reduce the peak current required to program the memory cells from that required if the memory cells are reset simultaneously.

Figure 5:
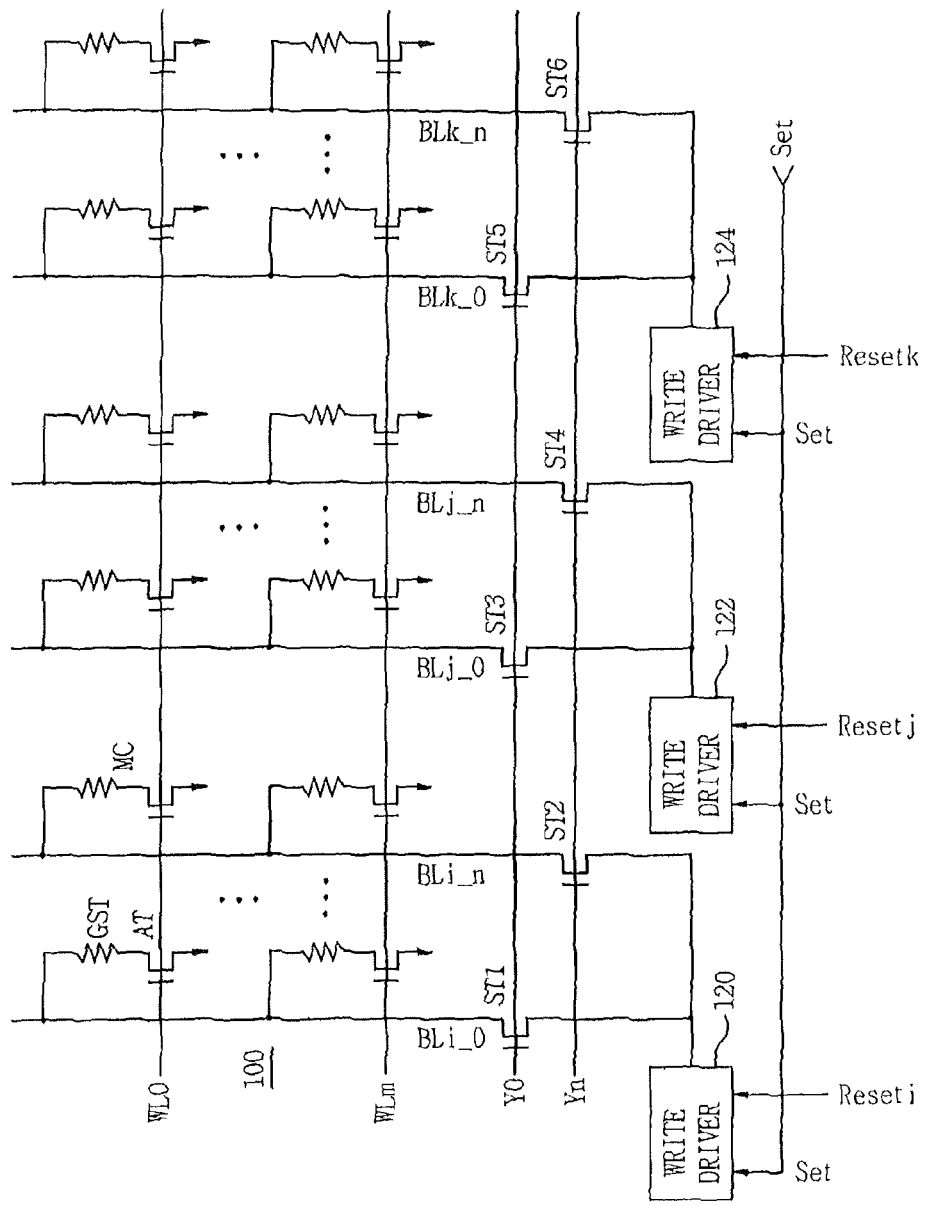
FIG. 5 is a block diagram of a portion of a phase change memory according to some embodiments of the present invention.

FIG. 5 is a schematic diagram of a phase change memory device 100 configured to provide sequential reset pulses according to some embodiments of the present invention. As seen in FIG. 5, the phase change memory device 100 includes a plurality of phase change memory cells MC that include an access transistor AT and a variable resistance that includes a phase change material GST. The access transistors AT are connected to respective word lines WL0 through WLm to control turning the access transistors AT on and off. The memory cells are also connected to respective bit lines BLi_0 ... BLi_n, BLj_0 ... BLj_n and BLk_0 ... BLk_n, Respective select transistors ST1, ST2, ST3, ST4, ST5 and ST6 are also provided to selectively couple the bit lines to a corresponding one of a plurality of write driver circuits 120, 122 and 124.

The word lines may be responsive to a row address decoder (not shown) and the bit lines may be selected responsive to a column address decoder (not shown). Such row and address decoders are well known in the art and need not be described further herein. As used herein, a word of data refers to the number of bits that are selected for a given output of the row address decoder and column address decoder (i.e. when a word line is active and a corresponding column select signal is active). In some embodiments of the present invention, a word includes 16 bits of data.

Furthermore, as illustrated in FIG. 5, a write driver may be coupled to multiple bit lines. The multiple bit lines may be from different words of data. In other embodiments, the some or all of the bit lines coupled to a write driver may be from the same word of data. As illustrated in FIG. 5, however, the bit lines coupled to the respective write drivers 120, 122 and 124 are from different words of data. Thus, in the embodiments illustrated in FIG. 5, the bit lines BLi_0 through BLi_n represent the ith bit of n words of data. In some embodiments of the present invention, four bit lines are coupled to each of the write drivers 120, 122 and 124.

Figure 6:
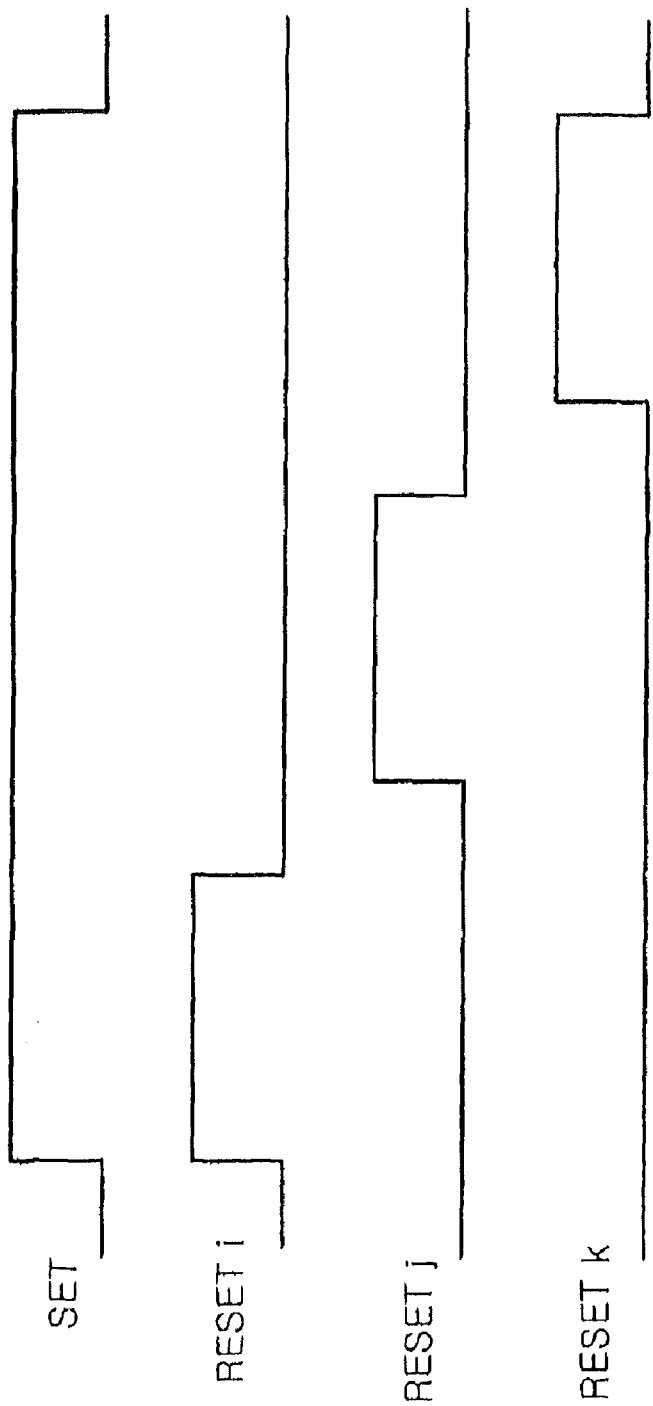
FIG. 6 is a timing diagram illustrating the timing of set and reset signals of the phase change memory of FIG. 5 according to some embodiments of the present invention.

As is further illustrated in FIG. 5, the plurality of write drivers 120, 122 and 124 each receive a common set signal and individual reset signals RESET i, RESET j and RESET k. As is illustrated in FIG. 6, the set signal Set may be a signal with a relatively long duration and the respective reset signals RESET i, RESET j and RESET k each have a shorter duration and are sequenced in time. The reset signals RESET i, RESET j and RESET k are provided as sequential reset pulses by a reset signal generator. Examples of a reset signal generator are discussed in further detail below. Thus, the reset signals RESET i, RESET j and RESET k may be sequentially applied to the write drivers 120, 122 and 124 such that fewer than all of the write drivers for a word of data are simultaneously active, which may reduce the peak current requirements when the memory cells are reset.

In some embodiments of the present invention, the set signal Set has a duration of from about 100 to about 500 nanoseconds (ns) and the sequential reset signals RESET i, RESET j and RESET k each have a duration of from about 10 to about 50 ns. The sequential reset signals are non-overlapping and, in some embodiments, may be spaced apart from each other by about 10 ns. In some embodiments of the present invention, the sum of the durations of the sequential reset signals is less than the duration of the set signal. By making the sum of the durations of the reset signals not greater than the duration of the set signal, the peak reset current may be reduced without extending the time it takes to program a word of data of the phase change memory device. Furthermore, while three reset signals are illustrated in FIGS. 5 and 6, fewer or greater numbers of reset signals may be provided. In some embodiments of the present invention, the number of reset signals is limited to the number of reset signals that may be provided without having the sum of the durations of the reset signals exceed the duration of the set signal.

While the embodiments illustrated in FIG. 5 show three write drivers 120, 122 and 124, such an illustration is merely an example configuration of a portion of a phase change memory device and fewer or greater numbers of write drivers may be provided. Furthermore, while FIG. 5 illustrates individual write drivers each having a separate reset signal, according to some embodiments of the present invention, groups of write drivers may receive the same signal, so long as the groups contain fewer than all of the write drivers for a word of data. Thus, for example, two or more write drivers in the same word of data may each receive the same reset signal. The groups of write drivers that receive the same reset signal may be uniform in number or non-uniform. For example, in some embodiments of the present invention, four sequential reset signals may be provided, each to four write drivers such that a 16 bit word of data is divided across four groups of write drivers.

Figure 7:
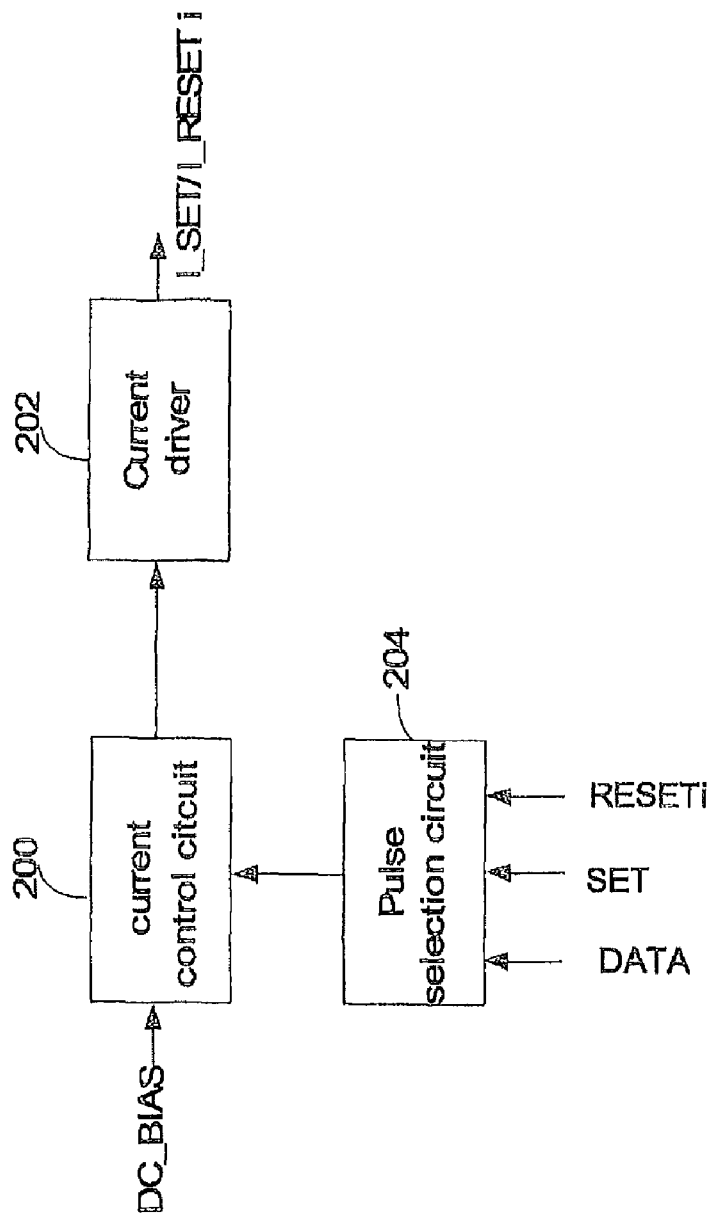
FIG. 7 is a block diagram of a write driver circuit according to some embodiments of the present invention.

FIG. 7 is a diagram of a write driver circuit according to some embodiments of the present invention that may be suitable for use as the write drivers 120, 122 and/or 124. As seen in FIG. 7, a write driver circuit according to some embodiments of the present invention include a current control circuit 200, a current driver circuit 202 and a pulse selection circuit 204. A bias voltage DC_BIAS is provided to the current control circuit 200. The current control circuit 200 is responsive to the pulse selection circuit 204 and controls the current driver 202 to output either a set or a reset pulse. The pulse selection circuit 204 receives a set pulse and one of the sequential reset pulses as illustrated in FIG. 6 and the data to be programmed in the phase change memory cell and uses the data to select one of the set pulse and the sequential reset pulse. The selected one of the set pulse and the sequential reset pulse controls the current control circuit and the current driver to drive the bit line at the time and for the duration substantially corresponding to the timing of the selected one of the set pulse and the sequential reset pulse.

Figure 8:
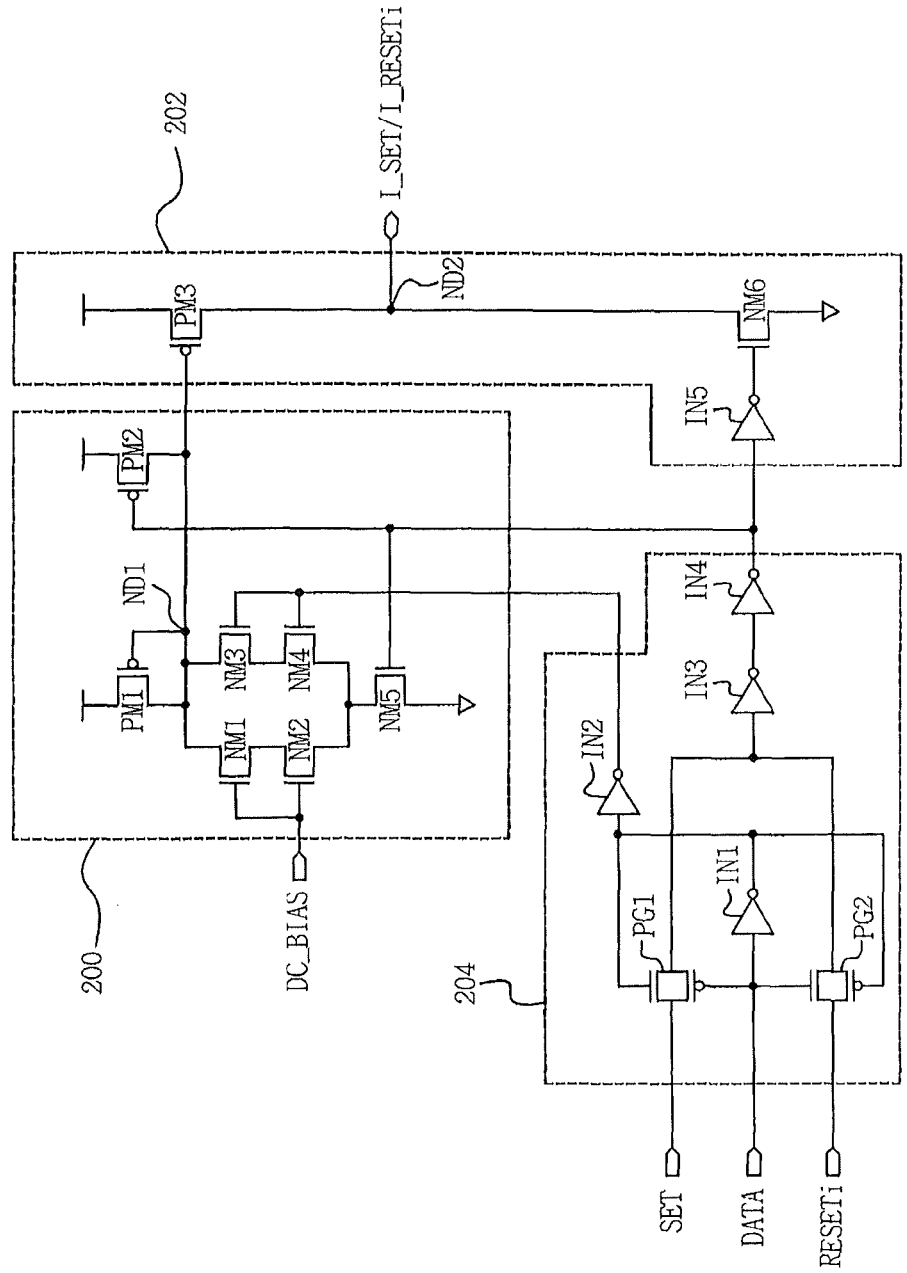
FIG. 8 is a schematic circuit diagram of the write driver of FIG. 7 according to some embodiments of the present invention.

FIG. 8 is a more detailed schematic diagram of the write driver circuit of FIG. 7 according to some embodiments of the present invention. As seen in FIG. 8, the DATA input selects between the SET and RESETi inputs and provides a signal corresponding to the selected one of the SET and RESETi inputs to the current control circuit 200. The current control circuit 200 controls the current supplied by the current driver circuit 202 by controlling the drive transistor PM3.

The duration of the output pulse I_SET/I_RESETi is controlled by the output of the inverter IN4 such that, when the output of the inverter IN4 is at a high level, the transistors NM6 and PM2 are off and the control of the drive transistor PM3 is based on the voltage of the node ND1 of the current control circuit 200. When the output of the inverter IN4 is at a low level, the transistor PM2 turns on, which turns off the drive transistor PM3. When the output of the inverter IN4 is at a low level, the output of the inverter IN5 is at a high level, which turns on the transistor NM6 and terminates the set/reset pulse I_SET/I_RESETi being at a high level. The output of the inverter IN4 is controlled by the selected one of the SET and RESETi inputs through the inverter IN3. Thus, the duration of the set/reset pulse I_SET/I_RESETi applied to a bit line by the write driver circuit may be controlled by the pulse duration of the selected one of the SET and RESETi inputs.

When the DATA input is at a high level so as to select the RESETi input through the pass gate PG2, the output of the inverter IN1 is low and the output of the inverter IN2 is high. Thus, the transistors NM3 and NM4 are turned on. The transistors NM1 and NM2 are always on as a result of being controlled by the DC_BIAS input. When the RESETi signal is at a high level, the output of the inverter IN4 is at a high level which turns on the transistor NM5 and turns off the transistor PM2. Currents of i1 flowing through the transistors NM1 and NM2 and i2 flowing through the transistors NM3 and NM4 are mirrored, so that a reset current of i1+i2 is provided at the output node ND2. When the reset signal RESETi returns to a low level, the transistors PM3 is turned off and the transistor NM6 is turned on to terminate the reset pulse as described above.

When the DATA input is at a low level so as to select the SET input through the pass gate PG1, the output of the inverter IN1 is high and the output of the inverter IN2 is low. Thus, the transistors NM3 and NM4 are turned off. The transistors NM1 and NM2 are always on as a result of being controlled by the DC_BIAS input. When the SET signal is at a high level, the output of the inverter IN4 is at a high level which turns on the transistor NM5 and turns off the transistor PM2. Only the current i1 flowing through the transistors NM1 and NM2 is mirrored, so that a set current of i1 is provided at the output node ND2. When the set signal SET returns to a low level, the transistors PM3 is turned off and the transistor NM6 is turned on to terminate the set pulse as described above.

Figure 9:
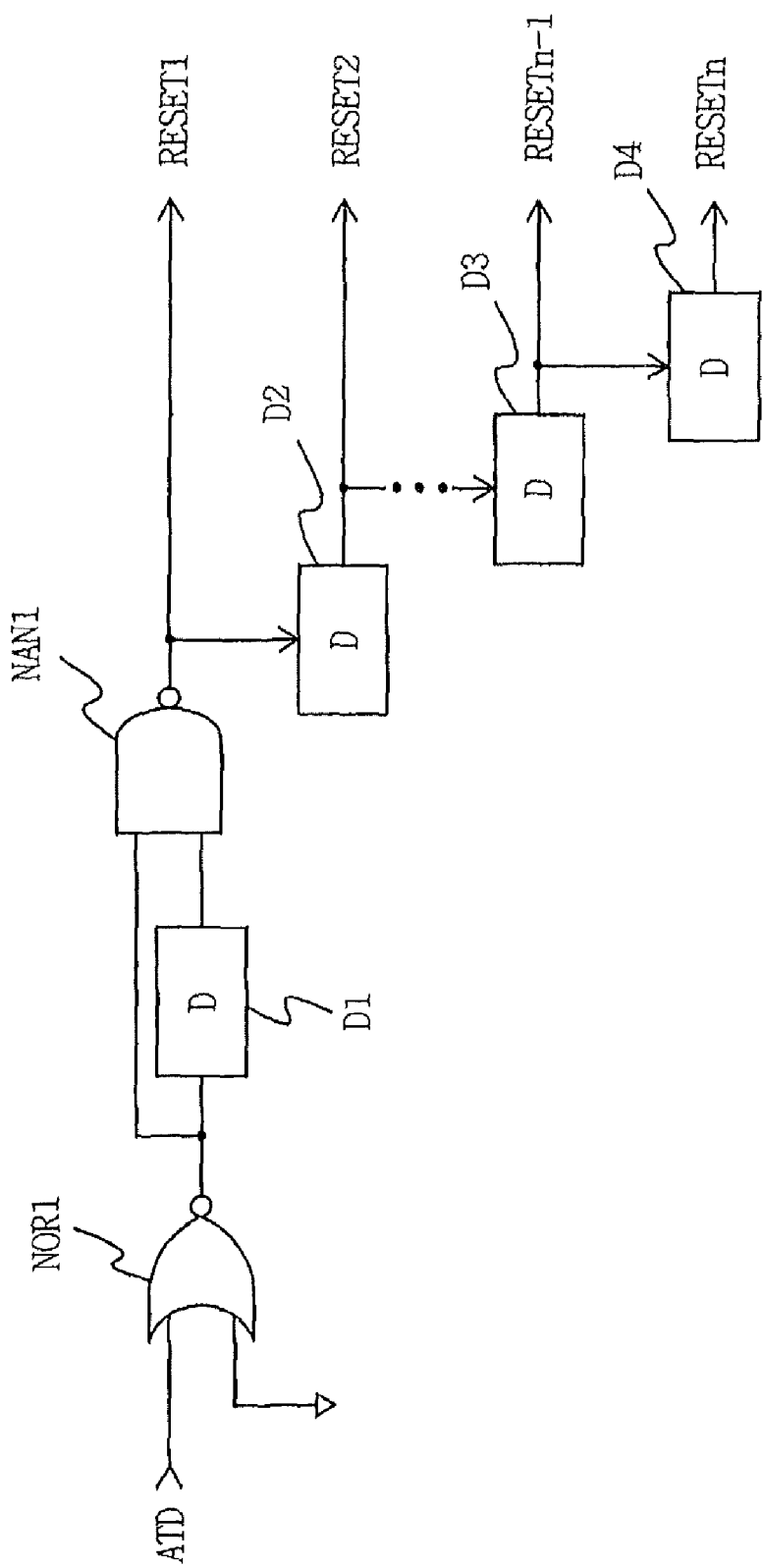
FIG. 9 is a circuit diagram of a reset control signal generator according to some embodiments of the present invention.

FIG. 9 is a schematic diagram of a reset signal generation circuit according to some embodiments of the present invention. As seen in FIG. 9, the reset pulse may be generated responsive to an address transition detection signal (ATD). In other embodiments of the present invention, the reset pulse may be generated responsive to a data transition detection signal (DTD). The ATD signal is provided to a NOR gate NOR1 that acts as an inverter such that when the ATD signal is high, the output of the of the NOR gate NOR1 is low and when the ATD signal is low, the output of the of the NOR gate NOR1 is high. The output of the NOR gate NOR1 is coupled to the input of a NAND gate NAN1 and to a delay element D1. The delay element D1 may be used to control the duration of the sequential reset pulses. Thus, the delay element D1, in some embodiments of the present invention, provides a pulse of from about 10 to about 50 ns. The output of the NAND gate NAN1 is provided to a plurality of serially connected delay elements D2, D3 and D4 where the output of the delay elements is provided as a subsequent one of the plurality of sequential reset pulses. In some embodiments of the present invention, the delay elements D2, D3 and D4 have a delay that is greater than the duration of the pulse output by the NAND gate NAN1 so as to provide non-overlapping sequential pulses. In some embodiments, the delay of the delay elements D2, D3 and D4 is greater than the duration of the pulse output by the NAND gate NAN1 by about 10 ns.

Figure 10:
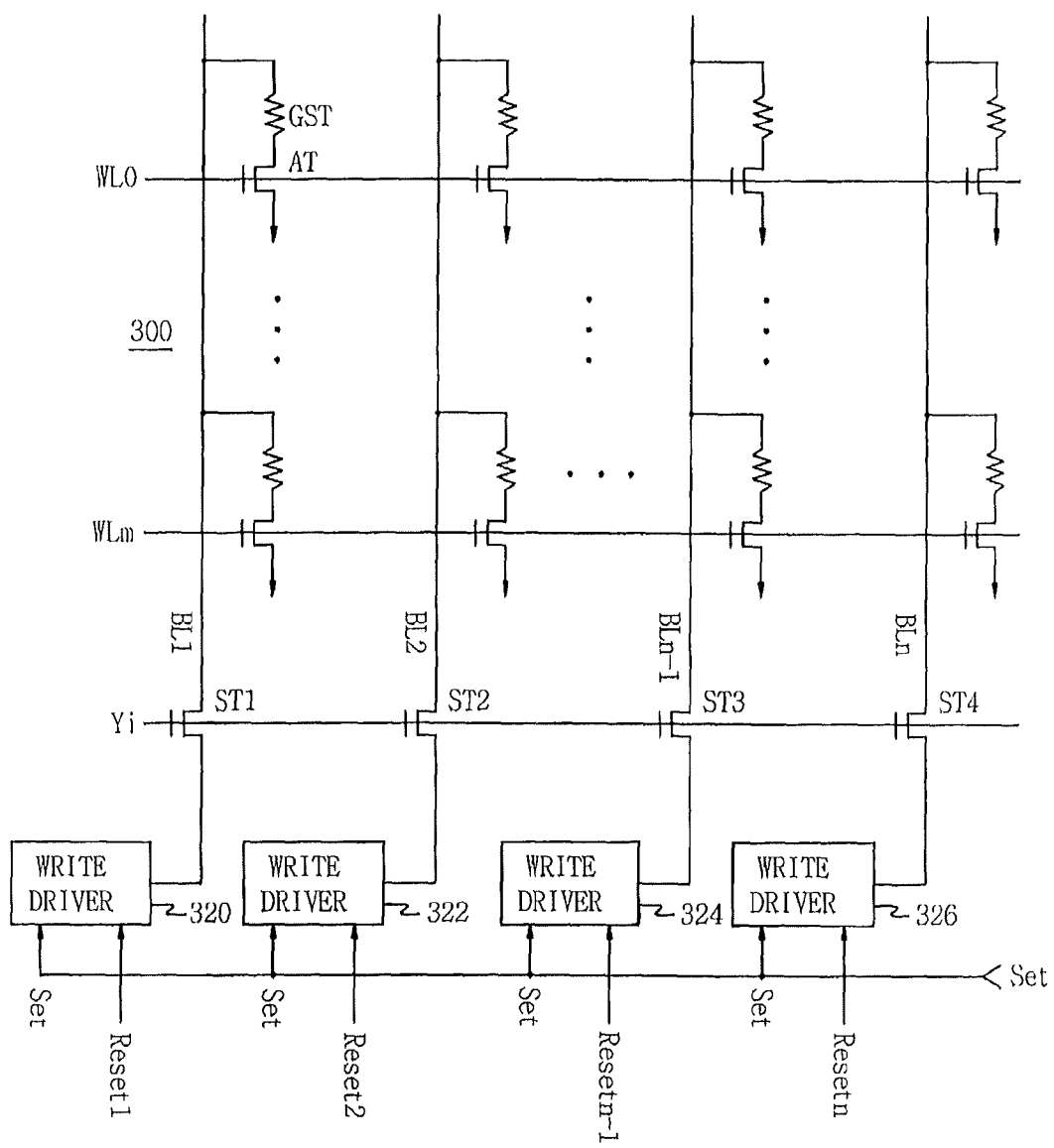
FIG. 10 is a block diagram of a portion of a phase change memory according to further embodiments of the present invention.
Figure 11:
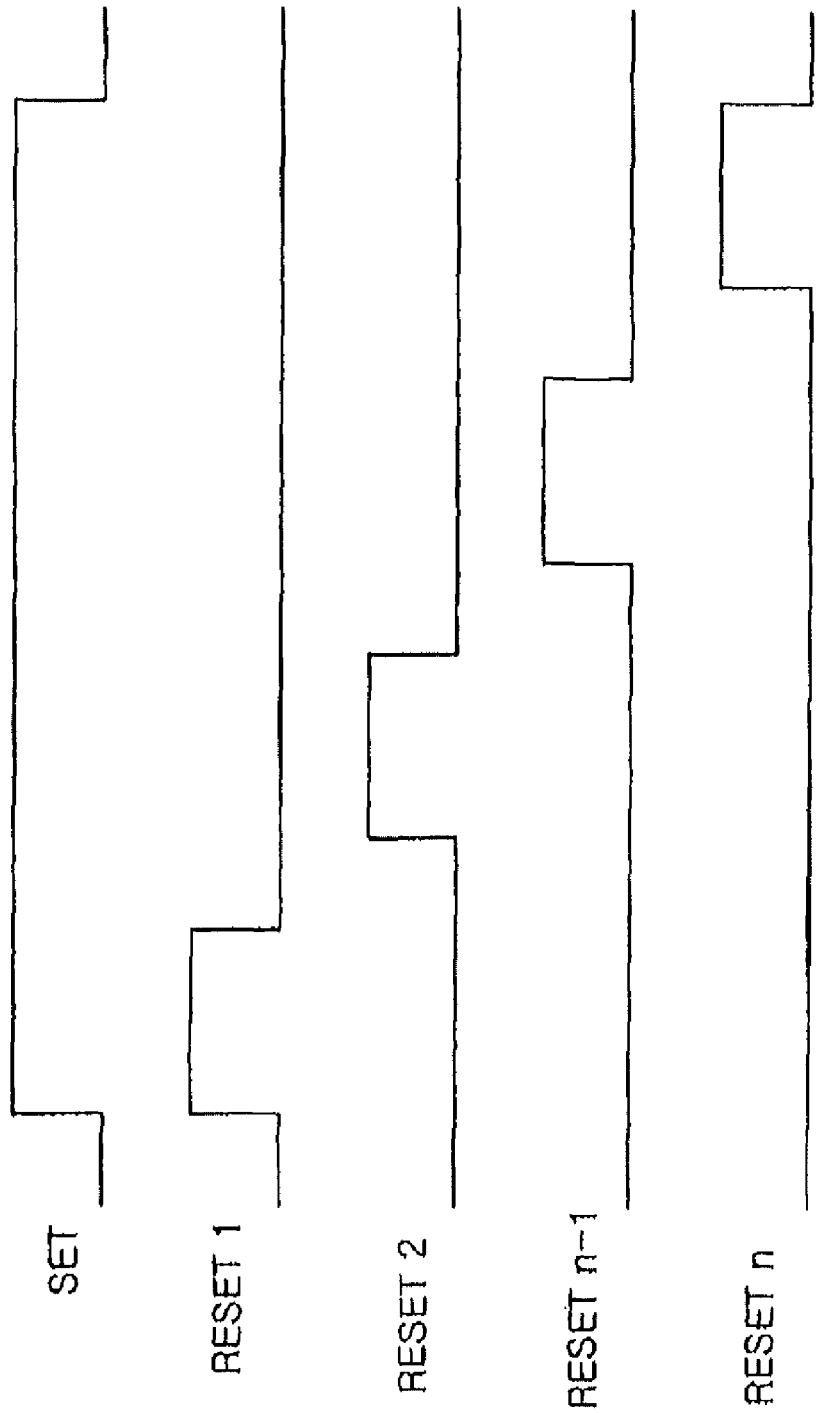
FIG. 11 is a timing diagram illustrating the timing of set and reset signals of the phase change memory of FIG. 10 according to some embodiments of the present invention.

FIG. 10 is a schematic diagram of a portion of a phase change memory device 300 according to further embodiments of the present invention. As seen in FIG. 10, the phase change memory cells may be provided as described above with reference to FIG. 5. However, the write driver circuits 320, 322, 324 and 326 are each connected to a single bit line. In such a case, the reset RESET1 . . . RESETn and set Set signals may be provided as illustrated in FIG. 11. The write driver circuits 320, 322, 324 and 326 may be provided as described above with reference to FIGS. 7 and 8. Furthermore, the reset pulse generation circuit of FIG. 9 may be utilized to provide sequential reset pulses to each of the individually connected write driver circuits 320, 322, 324 and 326. The durations and relationship of the reset pulses and the set pulse may be as described above with reference to FIGS. 5 and 6.

In operation, the phase change memory device 300 of FIG. 10 may provide sequential reset pulses to the respective write driver circuits 320, 322, 324 and 326. Because the reset pulses are sequentially applied to the write driver circuits 320, 322, 324 and 326, the peak current required for resetting phase change memory cells may be reduced as the number of write driver circuits 320, 322, 324 and 326 that are simultaneously driving the bit lines may be reduced.

As described above, some embodiments of the present invention may provide phase-change memory devices that include a plurality of phase-change memory cells and means for sequentially applying a reset pulse to subsets of the phase-change memory cells that are commonly connected to a word line. The means for sequentially applying a reset pulse may be provided, for example by the write driver circuits 120, 122 and 124 and/or 320, 322, 324 and 326, pulse generation circuits of FIG. 9 and interconnection of the write driver circuits to the phase change memory cells as described above with reference to FIGS. 5 and/or 10. In particular embodiments of the present invention, the plurality of phase-change memory cells are reset by applying a signal of a first pulse width to the phase-change memory cells and set by applying a signal of a second pulse width to the phase-change memory cells. In such a case, the means for sequentially applying a reset pulse may comprise means for sequentially applying a reset pulse wherein a duration of each of the sequentially applied reset pulses corresponds to the first pulse width and a sum of the durations of the sequentially applied reset pulses is not substantially greater than the second pulse width. Thus, the peak current may be reduced without increasing the programming timing for writing a word of data. Such means for sequentially applying a reset pulse may be provided by the configuration of the delay lines or other such pulse generation circuits that provided the appropriate timing relationships.

Furthermore, some embodiments of the present invention may provide means for applying a common set pulse to the subsets of the phase-change memory cells that are commonly connected to a word line. Such means may be provided, for example, by the interconnection of a set pulse generation circuit to the write driver circuits as discussed above.

While embodiments of the present invention have been described with reference to particular exemplary write driver circuits and/or reset pulse generation circuits, other techniques and/or circuits for providing sequentially applied reset pulses may be utilized. For example, pulse generation circuits that do not use delay lines may be utilized or any circuit that provides the desired sequential pulses with the appropriate timing relationship. Furthermore, the pulse width and sequential application of reset pulses to the bit lines could be accomplished outside the write driver circuits, for example, by serially activating the access transistors ST1, ST3 and ST5 while providing a common reset signal to the write driver circuits and controlling the reset pulse duration by controlling the duration of time that the access transistors are active.

Embodiments of the present invention have been described with reference to particular divisions of functions between, for example, a write driver circuit and a pulse generation circuit or functions within the write driver circuits. However, blocks in the diagrams may be combined or otherwise rearranged while still falling within the scope of the present invention. Accordingly, embodiments of the present invention are not limited to the particular illustrative examples discussed above but may include any circuit capable of carrying out the functions or operations described herein for sequentially providing reset pulses to phase change memory cells.

Some embodiments of the present invention may include a processor based device. Examples of processor based devices include a mobile computing device, a stationary computing device, and/or subsystems therein, among others. For example, some embodiments include application chipsets such as, for example, display integrated circuits and/or controllers, a camera image processor (CIS), and/or mobile DRAM, among others.

Figure 12:
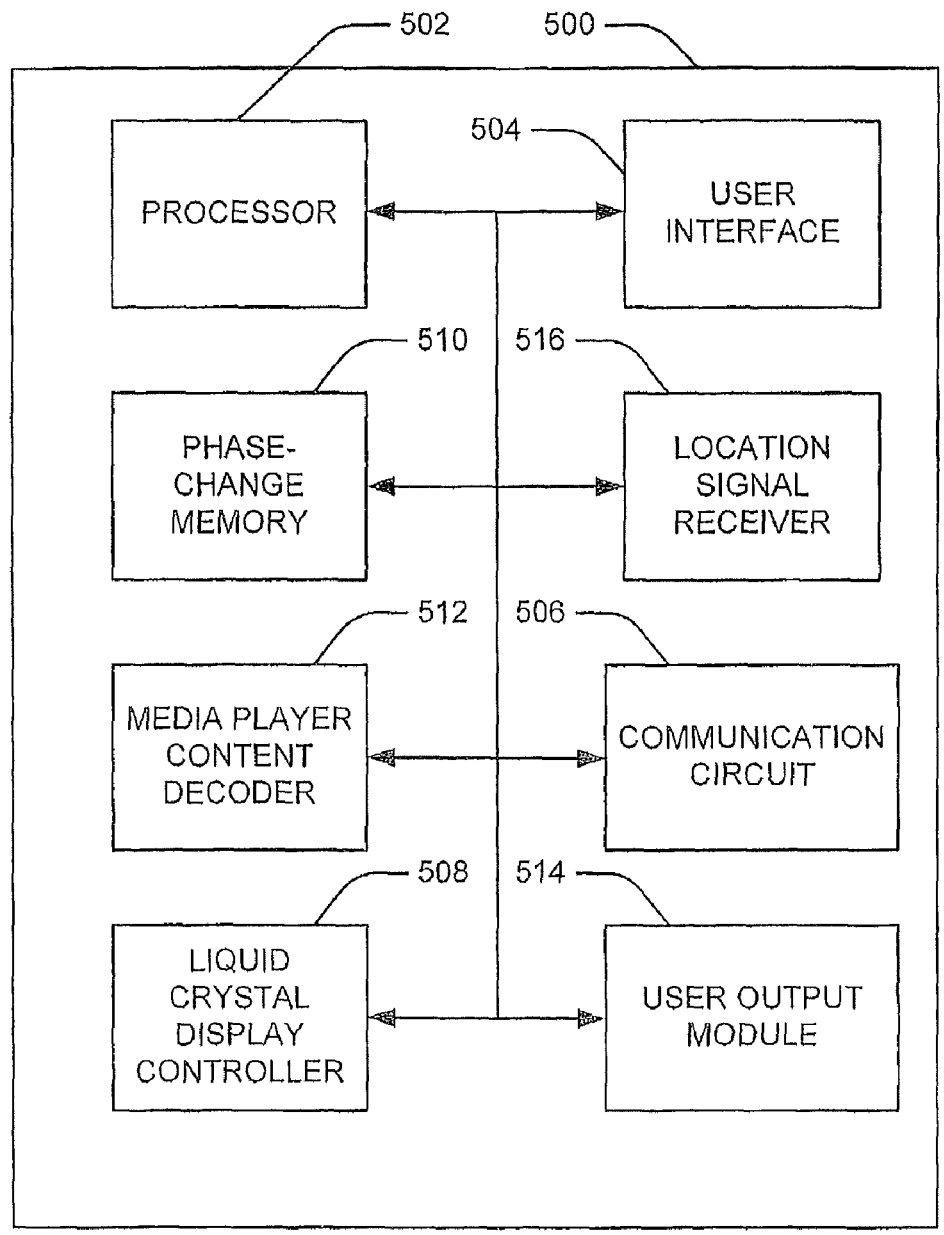
FIG. 12 is a block diagram illustrating a mobile computing device including phase-change memory according to some embodiments of the present invention.

Reference is now made to FIG. 12, which is a block diagram illustrating a mobile computing device including phase-change memory according to some embodiments of the present invention. Some embodiments of the present invention may include a mobile computing device 500 that includes a processor 502, a user interface 504 and a phase-change memory device 510 as described herein. Exemplary embodiments of a mobile computing device 500 may include a cellular telephone, personal digital assistant (PDA), navigation system, and/or a media player such as an audio or video player, among others. In embodiments described herein, use of the phase-change memory device 510 may provide advantages through reduced current and/or power consumption.

For example, some embodiments of mobile computing devices 500 described herein may include a wireless communication circuit 506 that is configured to be communicatively coupled to a communication system, network and/or device. In some embodiments, a mobile computing device 500 may include phase-change memory 510 that may be used to store identification numbers and/or be used in conjunction with a liquid crystal display controller 508 for controlling a liquid crystal display.

Some embodiments may include a content decoder 512 that is configured to decode content corresponding to audio and/or visual media and a user output module 514 that is configured to output an audio and/or visual signal corresponding to decoded content.

In some embodiments, a mobile computing device 500 may include a location signal receiver 516 that is configured to receive at least one signal that is configured to provide information regarding a geographical location of the mobile computing device 500.

Figure 13:
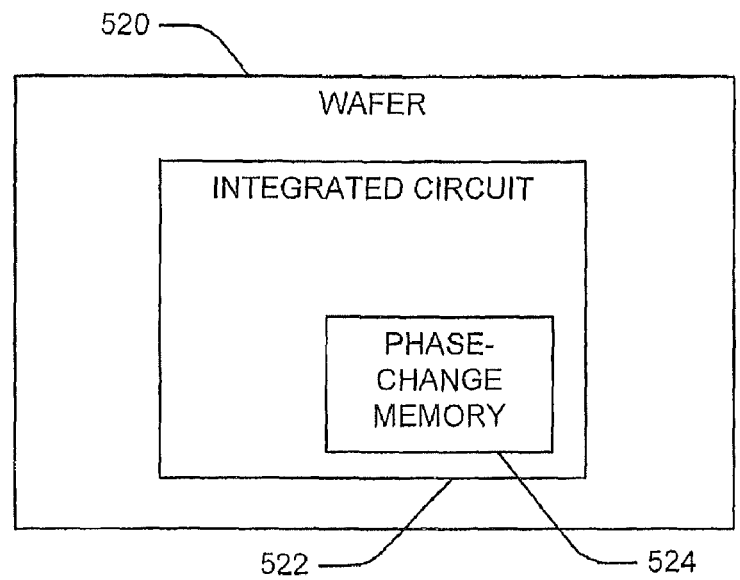
FIG. 13 is a block diagram illustrating an integrated circuit including phase-change memory according to some embodiments of the present invention.

Brief reference is now made to FIG. 13, which is a block diagram illustrating an integrated circuit including phase-change memory according to some embodiments of the present invention. Some embodiments may include an integrated circuit die that incorporates phase-change memory devices described herein. For example, a semiconductor wafer 520 may include an integrated circuit die 522 that may incorporate a phase-change memory device 524 as described herein. In some embodiments, phase-change memory as described herein may be included in an external device, such as, for example a computer. Such a computer may include a processor, phase-change memory and one or more system interfaces, among others.

Figure 14:
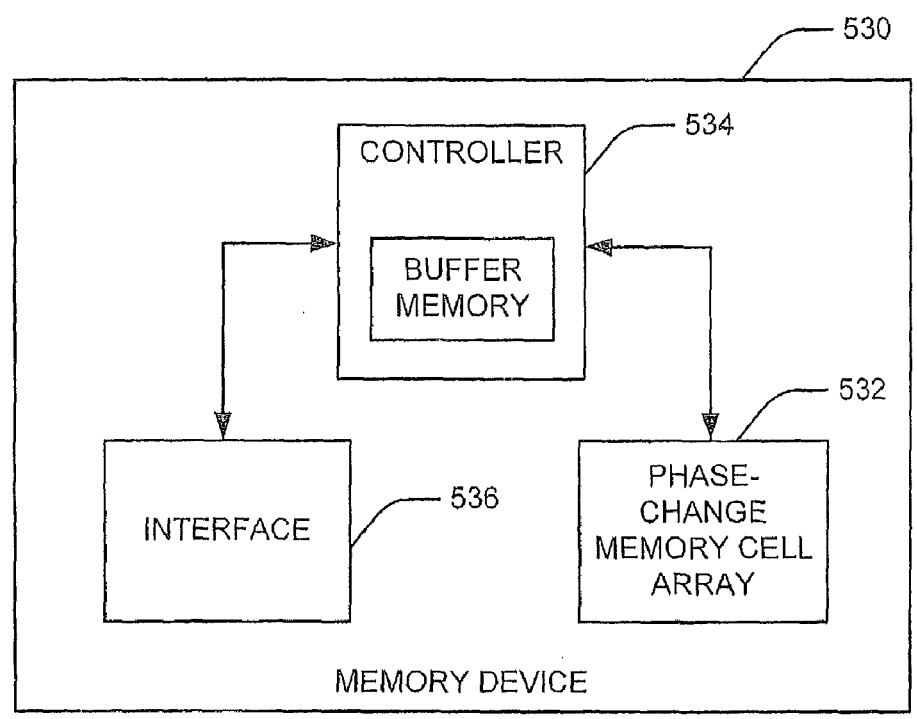
FIG. 14 is a block diagram illustrating a memory device according to some embodiments of the present invention.

Reference is now made to FIG. 14, which is a block diagram illustrating a memory device according to some embodiments of the present invention. Some embodiments of the present invention may include a semiconductor memory device 530 that includes a memory cell array 532 including multiple data-storing phase-change memory cells arranged in a matrix at intersections of word lines and bit lines. A semiconductor memory device 530 may include a decoder operative to select a memory cell in the memory cell array and a driver that is configured to drive the word and/or bit line. Exemplary embodiments of a semiconductor memory device 530 may include a memory card and/or portable and/or an embedded memory system that may be used within other devices that may benefit from advantages provided from reduced memory current and/or power consumption. Some embodiments of memory devices 530 may include commercial memory card formats such as, for example, Personal Computer Memory Card International Association (PCM-CIA), CompactFlash (CF), MultiMediaCard (MMC) and Secure Digital (SD), among others.

Figure 15:
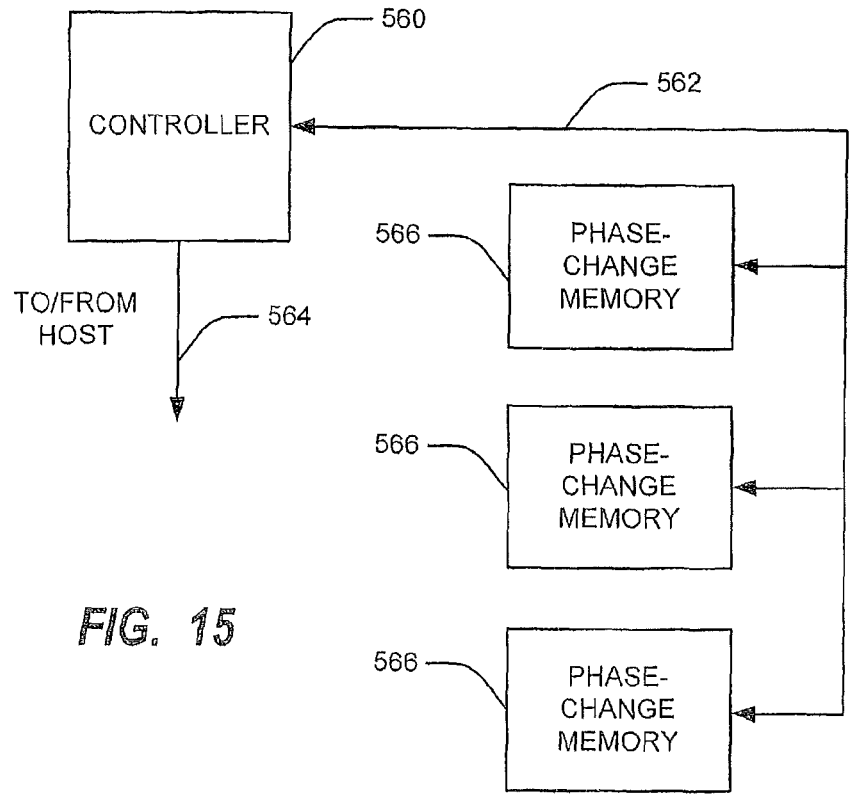
FIG. 15 is a block diagram illustrating phase-change memory devices/systems according to some embodiments of the present invention.

Reference is now made to FIG. 15, which is a block diagram illustrating phase-change memory devices/systems according to some embodiments of the present invention. In some embodiments, phase-change memory devices and/or systems described herein may include a controller 560 that may communicate with a host system over data and/or control lines 564. The controller 560 may communicate over data and/or control lines 562 to one or more phase-change memory devices 566. In some embodiments, the controller 560 may be configured on a single integrated circuit chip. In some embodiments, the controller 560 may be configured on an integrated circuit that includes a memory cell array of phase-change memory 566. Even if the memory cell array is included on an integrated circuit chip with the controller 560, additional one or more chips containing one or more memory cell arrays may be included in some embodiments of a device and/or system.

In some embodiments, user data may be transferred between the controller 560 and multiple memory arrays 566 over data lines 562. The memory arrays 566 may be individually addressed by the controller 560. In some embodiments, the data lines 562 may include a one byte wide data bus. A memory system as described herein may be embedded as part of a host system or packaged into a card, such as a card according to one or more of the commercial memory card formats described herein. In the case of a card, the data and/or control lines 564 may terminate in external terminals on the card for mating with a complementary socket within the host system.

The controller 560 may include a micro-processor and/or micro-controller connected through controller interface logic to internal memories and interfaces to external components. A program memory may store firmware and/or software accessed by the micro-controller to control the memory system operation to read data from the connected memory array(s) and transmit data to the host, to write data from a host to the memory chip(s), and to carry out numerous other monitoring and controlling functions.

In some embodiments, a logic circuit (not shown) may interface with the host communication lines 564, while another logic circuit (not shown) may interface with the memory array(s) 566 through the data and/or control lines 562. Another memory may be used as a buffer to temporarily store user data being transferred between the host system and the memory. The memories in the controller 560 may be volatile, since memories with fast access and other characteristics desired for efficient controller access may have that characteristic and may be combined physically into a single memory. A dedicated circuit may access the streaming user data being transferred to the memory 566 and may insert dummy bytes into the data stream in order to avoid writing valid user data to memory cells in bad columns. A dedicated processing circuit may also access the streaming data being transferred between the controller 560 and interfaces for generating an error correcting code ECC, or other type of redundancy code, based upon the user data. When user data is being transferred into the memory 566, the generated ECC may be appended onto the user data and simultaneously written into the same physical block of memory as part of the same sector as the user data.

Some embodiments of memory systems described herein may include multiple arrays of on-chip non-volatile memory having a hierarchical bit line structure with bit lines that may be specific to each of the multiple memory arrays and a second bit line that may be shared between the multiple memory arrays. Some embodiments may include a first selector circuit that may select the first bit line for each of the memory arrays to connect the selected first bit line to the second bit line. Some embodiments may include a sense amp that may be arranged between the output of the first selector circuit and the second bit line.

In some embodiments, a memory system may include a phase-change memory device 566 as described herein, an interface for interfacing with external components, and/or a controller 560 that may include buffer memory for performing operational control of the memory system. The controller 560 may couple to the interface via a data bus and/or an address bus and may couple to the phase-change memory via the data bus and/or the address bus. The phase-change memory may perform a synchronous read operation in addition to an asynchronous read operation.

Figure 16:
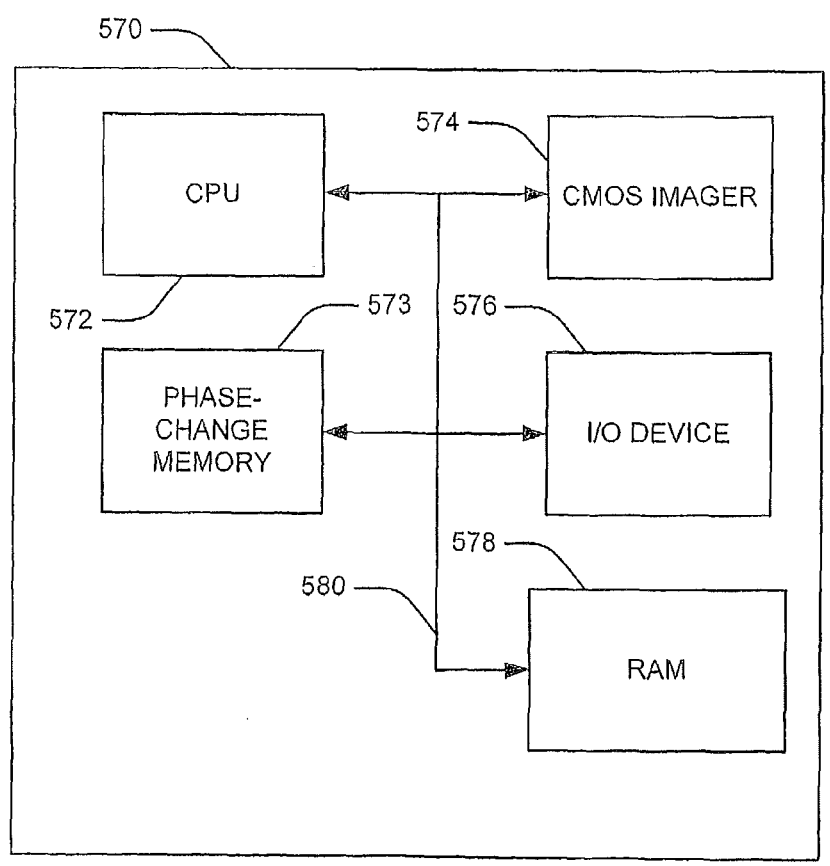
FIG. 16 is a block diagram illustrating a device that uses phase-change memory according to some embodiments of the present invention.

Reference is now made to FIG. 16, which is a block diagram illustrating a device that uses phase-change memory according to some embodiments of the present invention.

Some embodiments of the present invention include a system that comprises one or more CMOS imager devices. Examples of such devices include computer system, camera system, scanner, machine vision system, vehicle navigation system, video telephone, surveillance system, auto focus system, star tracker system, motion detection system, image stabilization system and/or data compression system for high-definition television, among others.

A processor system, such as a computer system, for example, generally may include a central processing unit (CPU) 572, for example, a microprocessor that communicates with an input/output (I/O) device 576 over a bus 580. The CMOS imager 574 also communicates with the system over the bus 580. The computer system may include a random access memory (RAM) 578 and may include phase-change memory 573 as described herein, which may also communicate with the CPU 572 over the bus 580. The CMOS imager 574 may be combined with a processor, such as a CPU, or digital signal processor or microprocessor, with or without memory storage in a single integrated circuit or may be on a different chip than the processor.

Figure 17:
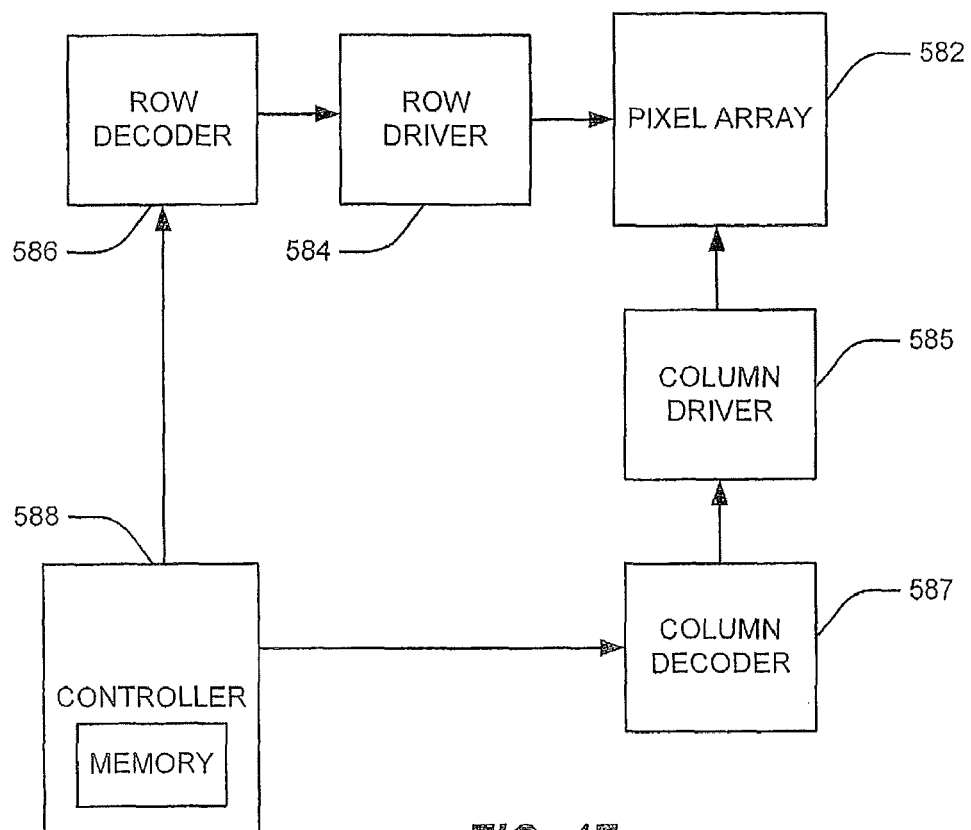
FIG. 17 is a block diagram illustrating a CMOS imager according to some embodiments of the present invention.

Reference is now made to FIG. 17, which is a block diagram illustrating a CMOS imager according to some embodiments of the present invention. A CMOS imager may include a pixel array 582 that may include multiple pixels arranged in a predetermined number of columns and rows. The pixels of each row may all be turned on at the same time via a row select line and the pixels of each column may all be turned on at the same time via a column select line. Multiple row and column lines are provided for the entire pixel array 582. The row lines are selectively activated by a row driver 584 in response to a row address decoder 586 and the column lines are selectively activated by a column driver 585 in response to a column address decoder 587. In this manner, a row and column address may be provided for each pixel. The CMOS imager may be operated by a control circuit that controls the row and column address decoders 586, 587 for selecting the appropriate row and column lines for pixel readout and row and column driver circuitry for applying a driving voltage to the drive transistors of the selected row and column lines.

Figure 18:
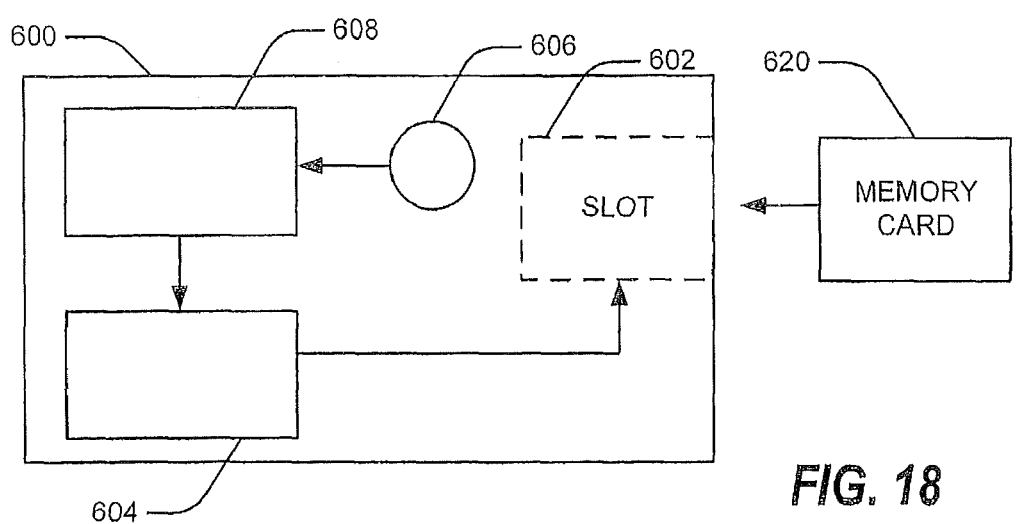
FIG. 18 is a block diagram illustrating an electronic device configured to receive an electronic card using a phase-change memory device described herein according to some embodiments of the present invention.

Reference is now made to FIG. 18, which is a block diagram illustrating an electronic device configured to receive an electronic card using a phase-change memory device described herein according to some embodiments of the present invention. Some embodiments of the present invention may include an electronic device that is configured to receive an electronic card that includes a phase-change memory device as described herein. In some embodiments, the electronic device may be a digital photography device 600. The electronic card may include a memory card 620 that contains a phase-change memory device type EEPROM described herein integrated and sealed therein.

A digital photography device 600, according to some embodiments, may include a card slot 602 and a circuit board 604 that is connected to the card slot 602. When attached to the card slot 602, the memory card 620 is electronically connected to electric circuits on the circuit board 604. If the memory card 620 is a non-contact type IC card, it may be electrically connected to the electric circuits on the circuit board 604 by radio signals when it is housed in or approached to the card slot 602.

In use and operation, the digital photography device 600 may receive light, which is converged through a lens 606 and input to an imaging device 608. The imaging device 608 may photoelectrically convert the light input into signal output, which may ultimately be converted into a digital signal. The digital signal may then be recorded on the memory card 620.

While the present invention has been particularly shown and described with reference to illustrative embodiments thereof, it will be understood by those of ordinary skill in the art that various changes in form and details may be made therein without departing from the spirit and scope of the present invention as defined by the following claims.

What is claimed is:

1. A method of writing data in a resistive variable memory cell in a memory array, the memory array, including N subsets, where N is not less than 2, the method comprising:
   selecting first memory cell in first subset of N subsets;
   selecting second memory cell in second subset of N subsets; and
   sequentially applying first current pulse to the first cell and second current pulse to the second cell, the first current pulse having a peak value being substantially smaller than the sum of peak values of the first current pulse and the second pulse required for individually operating the selected memory cell.

2. The method of claim 1, further comprising delaying the second current pulse to the second cell to be after the first current pulse to the first cell.

3. The method of claim 2, wherein the first current pulse and second current pulse are coupled to a write driver circuit.

4. The method of claim 3, wherein the write driver circuit includes a delay unit that is operable to delay the first current pulse and the second current pulse.

5. The method of claim 4, wherein the selected resistive variable memory cells are connected to different word lines.

6. The method of claim 5, wherein the selected resistive variable memory cells are connected to different bit lines.

7. The method of claim 5, wherein the write driver circuit is connected to different bit lines.

8. The method of claim 4, wherein the first current pulse and second current pulse are non-overlapping.

9. The method of claim 4, wherein the first current pulse and second current pulse are overlapping.

10. A method of writing data in a resistive variable memory cell in a memory array, the memory array including N subsets, each N subset having a first memory cell connected to a first bitline and a second memory cell connected to a second bitline, where N is not less than 2, the method comprising:
    selecting the first bitline connected to the first memory cell in a first subset of N subsets;
    selecting the second bitline connected to the second memory cell in a second subset of N subsets; and
    sequentially applying a first current pulse to the first bitline and a second current pulse to the second bitline, wherein the first current pulse and the second current pulse are delayed by a delay unit in a write driver.

11. The method of claim 10, wherein the first current pulse and second current pulse are non-overlapping.

12. A method of operating a resistive variable memory device, the method comprising:
    issuing write/read command address of N memory cells using current pulses, wherein N is greater than 1;
    receiving a done signal after a time duration has lapsed,
    wherein the time duration is less than a time of N multiplied by one reset pulse duration, and
    wherein current pulses include a peak value that is smaller than the sum of peak values of current pulses required for individually operating the selected resistive variable memory cells.

13. The method of claim 12 wherein the reset pulse duration is less than about 50 ns.

* * * * *